(12) United States Patent
Antonesei

(10) Patent No.: US 7,236,110 B2
(45) Date of Patent: Jun. 26, 2007

(54) SAMPLE RATE CONVERTER FOR REDUCING THE SAMPLING FREQUENCY OF A SIGNAL BY A FRACTIONAL NUMBER

(75) Inventor: Gabriel Antonesei, County Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/272,254

(22) Filed: Nov. 10, 2005

(65) Prior Publication Data

US 2006/0103555 A1 May 18, 2006

Related U.S. Application Data

(60) Provisional application No. 60/627,648, filed on Nov. 12, 2004.

(51) Int. Cl.
*H03M 7/00* (2006.01)
(52) U.S. Cl. ......................... 341/61; 341/143
(58) Field of Classification Search ............ 341/61, 341/143
See application file for complete search history.

(56) References Cited

U.S. PATENT DOCUMENTS

| | | | |
|---|---|---|---|
| 4,725,972 A * | 2/1988 | Gockler | 708/313 |
| 4,903,019 A * | 2/1990 | Ito | 341/61 |
| 5,489,903 A | 2/1996 | Wilson et al. | |
| 5,512,897 A | 4/1996 | Wilson et al. | |
| 5,625,359 A | 4/1997 | Wilson et al. | |
| 5,907,295 A * | 5/1999 | Lin | 341/61 |
| 5,982,305 A * | 11/1999 | Taylor | 341/61 |
| 6,546,407 B2 | 4/2003 | Jiang et al. | |
| 6,650,258 B1 | 11/2003 | Kelly et al. | |

FOREIGN PATENT DOCUMENTS

EP 0881764 12/1998

OTHER PUBLICATIONS

Göckler, "Polyphase Realisation of Fractional Sample Rate Converters" Proceedings of the European conference on Circuit Theory and Design, vol. 1, 1999, pp. 105-408, no month.

* cited by examiner

*Primary Examiner*—Peguy JeanPierre
(74) *Attorney, Agent, or Firm*—Gauthier & Connors LLP

(57) ABSTRACT

A sample rate converter reduces the sampling rate of a signal by a fractional number U/D, where U represents an up-sampling rate and D represents a down-sampling rate. The converter comprises an input for receiving an input data stream at a first rate and an FIR filtering stage. The FIR filtering stage comprises a set of D polyphase filter branches, each branch including a set of filter coefficients which operate on a sample of the input signal. The converter also comprises a commutative switch which selectively connects a sample of the input data stream to one of the polyphase filter branches, the switch being arranged to skip every U−1 filter branches during a cycle through the filter branches. An output outputs an output data stream at a second data rate which is lower than the first data rate.

18 Claims, 15 Drawing Sheets

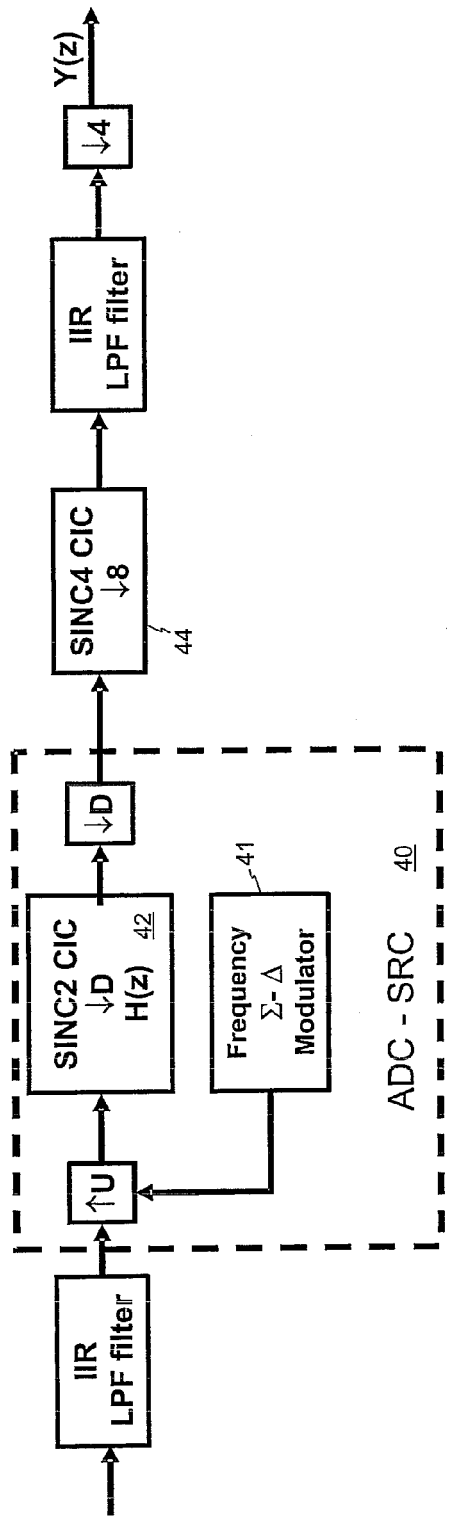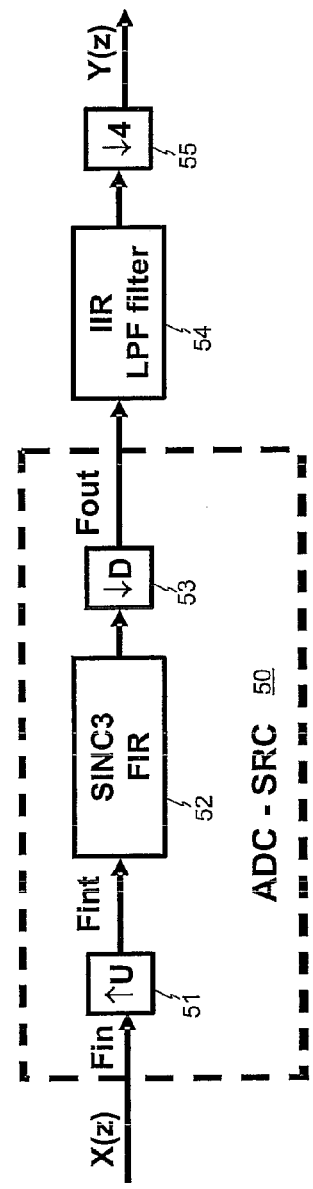
Fig. 5 (Prior Art)
Fig. 6

| Step no. | 1 | 2 | 3 | 4 | 5 | 6 | 7 | 8 | 9 | 10 | 11 | 12 | 13 | 14 | 15 | 16 | 17 | 18 | 19 |
|---|---|---|---|---|---|---|---|---|---|---|---|---|---|---|---|---|---|---|---|
| Filter branch no. | 1 | 5 | 9 | 13 | 17 | 4 | 8 | 12 | 16 | 3 | 7 | 11 | 15 | 2 | 6 | 10 | 14 | 18 | 19 |
| Index3 | 1 | 5 | 9 | 13 | 17 | 21 | 25 | 29 | 33 | 37 | 41 | 45 | 49 | 2 | 6 | 10 | 14 | 18 | 5 |
| Index2 | 18 | 22 | 26 | 30 | 34 | 38 | 42 | 46 | 50 | 3 | 7 | 11 | 15 | 19 | 23 | 27 | 31 | 35 | 22 |
| Index1 | 35 | 39 | 43 | 47 | 51 | 4 | 8 | 12 | 16 | 20 | 24 | 28 | 32 | 36 | 40 | 44 | 48 | 1 | 39 |
| DIN | 1 | 1 | 1 | -1 | 1 | -1 | -1 | 1 | 1 | 1 | -1 | -1 | -1 | -3 | 1 | 1 | 1 | -1 | 1 |
| MAC1 | + | + | + | + | + | + | + | + | + | + | + | + | 0 | + | + | + | + | + | -1 |
| MAC2 | + | + | + | + | + | + | + | + | 0 | 6 | + | + | + | + | + | + | + | + | + |
| MAC3 | + | + | + | + | 0 | -10 | + | + | + | + | + | + | + | + | + | + | 0 | -1 | + |
| DOUT |  |  |  | MAC3 |  |  |  |  | MAC2 |  |  |  | MAC1 |  |  |  | MAC3 |  |  |

Fig. 15

SAMPLE RATE CONVERTER FOR REDUCING THE SAMPLING FREQUENCY OF A SIGNAL BY A FRACTIONAL NUMBER

PRIORITY INFORMATION

This application claims priority from provisional application Ser. No. 60/627,648 filed Nov. 12, 2004, which is incorporated herein by reference in its entirety.

FIELD OF THE INVENTION

This invention relates to sample rate conversion, which may be required as part of an analog-to-digital converter (ADC) or a Digital Down Converter (DDC).

BACKGROUND TO THE INVENTION

Analog-to-digital converters (ADCs) are increasingly being based on an oversampling technique such as a sigma-delta (ΣΔ) architecture. FIG. 1 illustrates a simple architecture as used in a sigma delta analog-to-digital converter (ADC). An analog sigma-delta modulator 11 receives an analog input signal 10 and generates a high rate, low bitwidth, digital signal 12. This signal is then applied to a digital decimation stage 13 which converts the signal to a lower rate, higher bitwidth, digital signal 14. The sigma-delta modulator 11 can be a single bit or a multi-bit modulator.

One popular solution for the decimator is a Cascaded Integrator-Comb (CIC) filter that was first proposed by E. B. Hogenauer. As shown in FIG. 2, the CIC filter includes a chain of three integrators 21, a down-sampler 22 operating at a rate R, and a chain of three comb filters 23. The CIC filter is very economical in terms of hardware resources and also has the advantage that the transfer function has a sinc characteristic that depends on the decimation rate (R). However, this solution cannot achieve decimation by a fractional number.

Another possibility is to use an FIR filter 24 for the anti-aliasing filter, in the first stage of the decimator, as shown in FIG. 3. The anti-aliasing filter 24 is followed by a down-sampler 25. This FIR filter will have a SINC3 characteristic in the frequency domain. In this case, there will be no direct correlation between the value of the decimation factor (D) and the characteristic of the filter. This has a disadvantage that a change in the decimation factor requires a new set of FIR filter coefficients. Also, for large values of the decimation factor, the FIR filter requires a large number of coefficients. The exact number of coefficients is 3D−2.

There is an increasing need in various applications to decimate the bitstream from the sigma-delta modulator of an ADC by a fractional number, i.e. by a non-integer number. A typical solution to achieve decimation by a fractional number is to perform an interpolation operation on a bitstream and then to follow this by performing a decimation operation on the bitstream. The combination of the interpolation and decimation operations achieves a desired fractional conversion rate. Apparatus which includes an interpolator and a decimator of this kind is generally known as a Sample Rate Converter (SRC). FIG. 4 schematically shows a Sample Rate Converter. An input signal X(z) having a sampling frequency Fin is up-sampled 26 to a frequency Fint, passed through a filter 27 and then down-sampled 28 to a sampling frequency Fout. As shown, this may additionally be passed through an IIR filter and a further down-sampling stage. Filter 27 performs anti-imaging filtering for the up-sampler 26 and anti-aliasing filtering for the down-sampler 28.

FIG. 5 shows a known Sample Rate Converter as used in an integrated circuit manufactured by Analog Devices with the identification code AD6535. The Sample Rate Converter 40 includes a fractional up-sampling function which uses a sigma-delta (ΣΔ) modulator 41 cascaded with a second-order CIC decimator 42. The sigma-delta modulator 41 is dedicated specifically to the Sample Rate Converter 40. Subsequently, a fourth-order CIC 44 decimates by a factor of eight. A similar technique is described in U.S. Pat. No. 5,625,359 (Wilson et al.), where the clock rate of a sigma-delta modulator is varied to achieve a non-uniform sampling rate of an analog signal. One issue with this arrangement is that only a CIC filter 42 with the maximum order of two can be used and therefore another stage of filtering 44 and decimation is required. Another issue is that it requires an additional sigma-delta modulator. Both of these issues have a disadvantage of requiring further die space and power to implement.

The present invention seeks to provide an alternative way of performing sample rate conversion by a fractional number. In particular, the present invention seeks to provide a sample rate converter which requires fewer filtering stages and which requires less die space to implement.

SUMMARY OF THE INVENTION

A sample rate converter reduces the sampling rate of a signal by a fractional number U/D, where U represents an up-sampling rate and D represents a down-sampling rate. The converter comprises an input for receiving an input data stream at a first rate and an FIR filtering stage. The FIR filtering stage comprises a set of D polyphase filter branches, each branch including a set of filter coefficients which operate on a sample of the input signal. The converter also comprises a commutative switch which selectively connects a sample of the input data stream to one of the polyphase filter branches, the switch being arranged to skip every U−1 filter branches during a cycle through the filter branches. An output outputs an output data stream at a second data rate which is lower than the first data rate.

The sample rate converter has an advantage of removing the need to up-sample the input data stream. This removes the need to perform calculations on samples which will only be discarded. This reduces the amount of computation required in the filter. This also avoids the need to operate at a high frequency which may not be readily available on an integrated circuit. The sample rate converter can also have the advantage of reducing the overall number of filtering stages used, compared with conventional sample rate converters, as the FIR filtering stage can offer a high degree of anti-aliasing filtering. Preferably, the FIR filtering stage has a SINC3 response. This will have nulls at frequencies equal to multiples of Fout, ensuring the best possible attenuation of aliases using this kind of function. Applying a high level of filtering within the sample rate converter can allow the removal of a previously needed SINC4 filter (see SINC4 filter 44 in FIG. 5). This allows reductions in die area and power consumption.

Preferably, the filter coefficients are calculated on demand. This provides flexibility in changing the sampling rate of a digital signal and reduces the amount of storage required for filter coefficients. Any fractional conversion rate can be achieved by choosing the values of U and D. A specific filter coefficient is determined by the index position of this coefficient inside the FIR filter (this depends on the up-sampling rate U) and the formula that takes this index and calculates the coefficient (this depends on the down-sampling rate D).

Preferably, each polyphase filter branch comprises N coefficient multiplication stages where a coefficient is multiplied by an input sample. The converter comprises N multiplier and accumulation units, with each multiplier and accumulation unit being arranged to perform a coefficient multiplication stage of a plurality of filter branches and to the accumulate the results. This can be achieved by rearranging the elements of the filtering stage and has the advantage of reducing the amount of hardware required to perform the filtering. In this way, a small number of multiplier and accumulation units is reused to perform the required multiplication stages of the filter branches. Each multiplier and accumulation unit is effectively allocated to a column of the filtering stage. It is possible to move accumulated data values from one multiplier and accumulation unit to another after each switching cycle such that an output sample is always taken from one multiplier and accumulation unit. Alternatively, the coefficients applied to the coefficient multiplication stages can be managed in such a way that each multiplier and accumulation unit can accumulate results over a sequence of N switching cycles and after each switching cycle an output sample is taken from one of the multiplier and accumulation units. On each of the N switching cycles a different one of the N multiplier and accumulation units provides the output sample, on a rotational basis. This has a further advantage of reducing the amount of data movement within the hardware.

The sample rate converter can be used as part of an analog-to-digital converter (ADC) chain, where it is required to perform decimation by a fractional value, or as part of a digital chain where there is a need to reduce the sample rate, such as a Digital Down Converter (DDC).

A further aspect of the invention provides a method of performing sample rate conversion.

The sample rate converter described here can be implemented in hardware, such as an application specific integrated circuit (ASIC), or by a more general processing platform which executes instructions (e.g. software) to perform the sample rate conversion. Accordingly, another aspect of the invention provides a machine-readable medium carrying instructions for causing a processor to perform any of the steps of the sample rate conversion method. The instructions may be stored on an electronic memory device, hard disk, optical disk or other machine-readable storage medium.

BRIEF DESCRIPTION OF THE DRAWINGS

Embodiments of the invention will be described with reference to the accompanying drawings in which:

FIG. 5 shows a known form of Sample Rate Converter which uses a SINC2 CIC filter and a SINC4 CIC filter;

FIG. 6 shows a Sample Rate Converter which uses a SINC3 FIR filter;

FIG. 15 is a table which illustrates operation of the filter;

DESCRIPTION OF PREFERRED EMBODIMENTS

Figure 1:
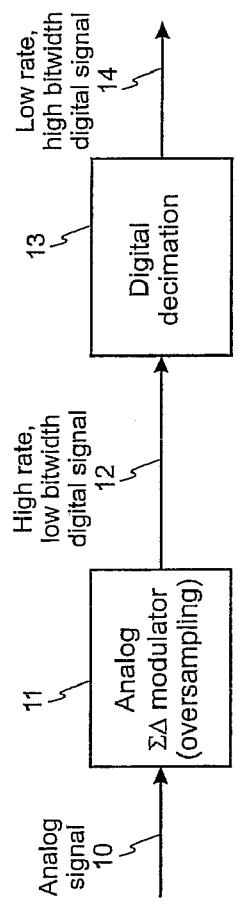
FIG. 1 shows the stages of a conventional sigma-delta analog-to-digital converter.

The present invention will be described with respect to particular embodiments and with reference to certain drawings but the invention is not limited thereto but only by the claims. The drawings described are only schematic and are non-limiting.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of the terms "including," "comprising," "having," "containing," or "involving," and variations thereof herein, is meant to encompass the items listed thereafter and equivalents thereof as well as additional items.

Referring again to FIG. 6, this schematically shows a sample rate converter (SRC) which forms the basis of that used in the present invention. FIG. 6 schematically shows a sample rate converter (SRC) which is based around a SINC3 FIR filter. An up-sampling block 51 receives data at a rate Fin and outputs data at a rate Fint. An FIR filter 52 having a SINC3 response operates on the up-sampled data and the resulting signal is applied to a down-sampling block 53 to output data at a rate Fout. This can subsequently be applied to an IIR low-pass filter 54 and a further down-sampling block 55. The process of up-sampling inserts additional samples, each having a value of zero, into the input data stream.

One of the main issues with a SRC of this kind is that a clock signal at the rate Fint often does not exist on the circuit. The following table gives two example scenarios, where data is up-sampled by a factor of 16 and down-sampled by a factor of 325 to achieve a fractional conversion rate of 16/325. For an input data rate of 650 kHz the up-sampled data would have an Fint rate of 10.4 MHz and for an input data rate of 1.3 MHz the up-sampled data would have an Fint rate of 20.8 MHz. These values of Fint can be prohibitively large.

| U/D | Fin | Fint | Fout |
| --- | --- | --- | --- |
| 16/325 | 650 kHz | 10.4 MHz | 32 kHz |
| 16/325 | 1.3 MHz | 20.8 MHz | 64 kHz |

A further issue in using an FIR SINC3 filter is that it is necessary to use a large number of coefficients which need to be locally stored and that these coefficients vary with the decimating factor D, i.e. a different set of coefficients is needed for each decimating factor.

The following description explains how the arrangement shown in FIG. 6 can be transformed into a more efficient structure and how this can be implemented in hardware.

The FIR filter 52 can be described by an equivalent formula in the Z-domain:

$$H(z) = \left(\sum_{k=1}^{D} z^{-(k-1)}\right)^3 = \sum_{k=1}^{3D-2} c_k \cdot z^{-(k-1)} \quad \text{Eqn. 1}$$

where the $c_k$ coefficients are given by the formula:

$$c_k = \begin{cases} \frac{k(k+1)}{2} & \text{if } k \leq D \\ \frac{[(k-N)(3D-3-2k)+(D+1)]}{2} & \text{if } D < k \leq \frac{(3D-2)}{2} \\ c_{3D-2-k} & \text{if } k > \frac{(3D-2)}{2} \end{cases} \quad \text{Eqn. 2}$$

The next step is to rearrange the terms of the new H(z) function:

$$H(z) = \sum_{k=1}^{3D-2} c_k \cdot z^{-(k-1)} \quad \text{Eqn. 3}$$

$$= \sum_{k=1}^{D} (c_k \cdot z^{-(k-1)} + c_{k+D} \cdot z^{-(k-1)-D} + c_{k+2D} \cdot z^{-(k-1)-2D})$$

$$= \sum_{k=1}^{D} (c_k + c_{k+D} \cdot z^{-D} + c_{k+2D} \cdot z^{-2D}) z^{-(k-1)}$$

If we note:

$$E_k(z^D) = (c_k + c_{k+D} \cdot z^{-D} + c_{k+2D} \cdot z^{-2D}) \quad \text{Eqn. 4}$$

we get the final expression for H(z):

$$H(z) = \sum_{k=1}^{D} z^{-(k-1)} \cdot E_k(z^D) \quad \text{Eqn. 5}$$

Figure 7:
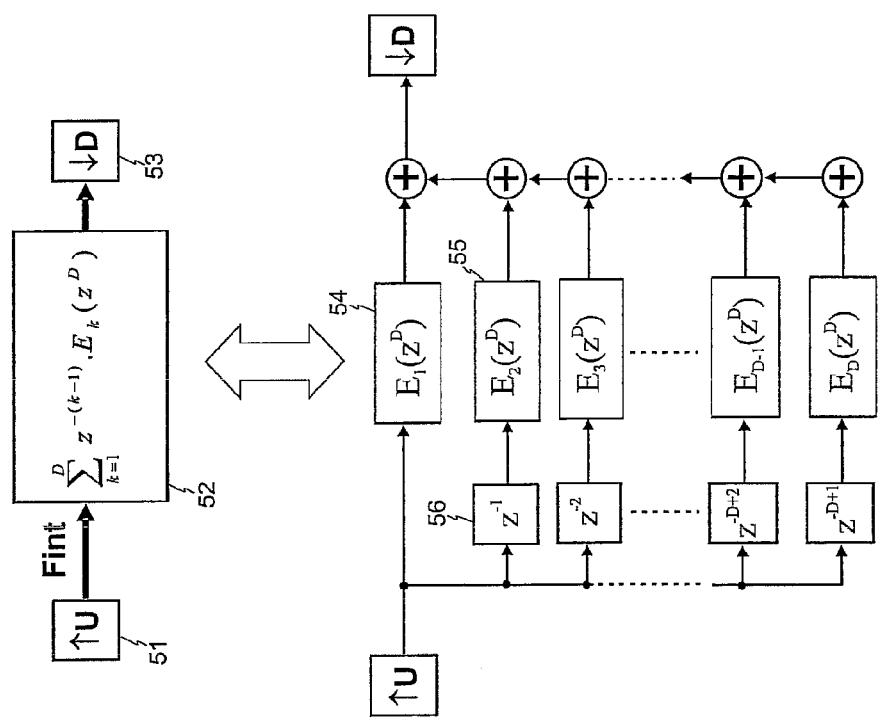
FIG. 7 shows a polyphase form of the FIR filter of FIG. 6.
Figure 8:
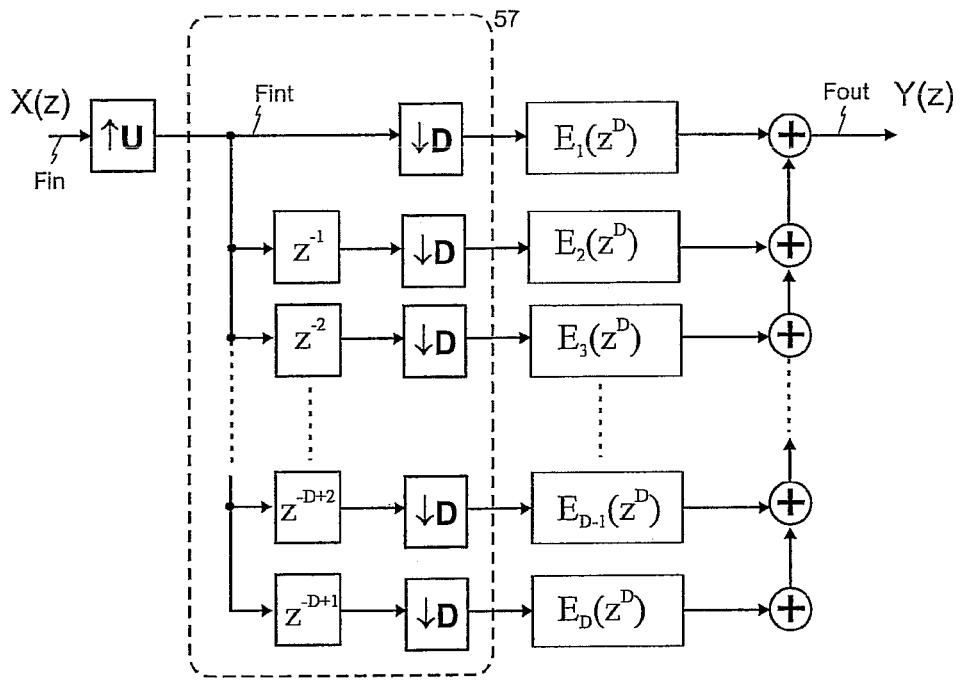
FIGS. 8 and 9 show transformations of the polyphase filter to eliminate the up-sampling unit.
Figure 9:
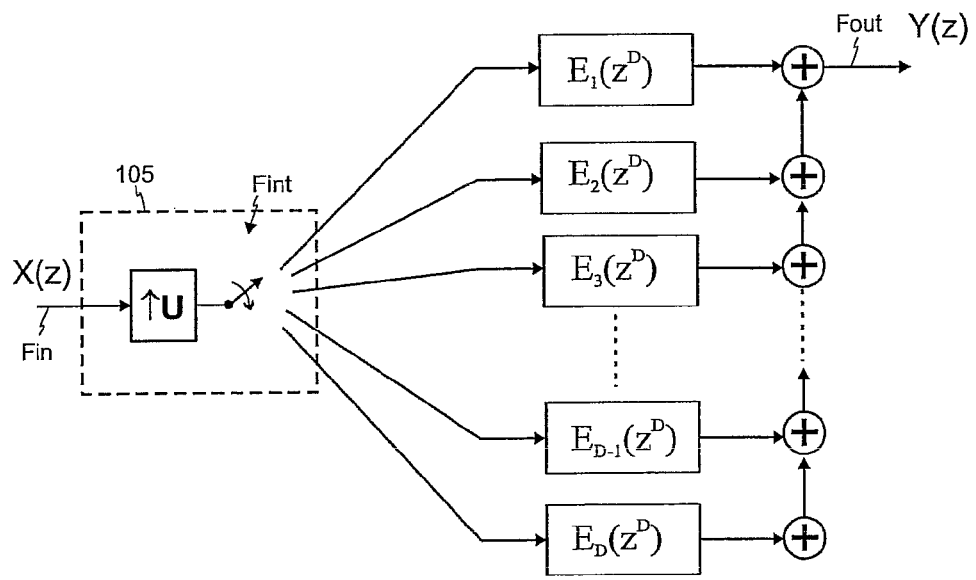

This leads to a polyphase decomposition of the SINC3 FIR filter, as shown in FIG. 7. Filter 52 is equivalent to the set of branches (two of which are labelled 54, 55) and delay elements 56. Using multirate DSP techniques the down-sampling block 53 is moved in front of the polyphase filter branches, as shown in FIG. 8. Next, the set of delay elements and the down-sampling units 57 from each polyphase branch are replaced by a commutative switch, i.e. a switch which selectively connects the input to one of the filter branches, as shown in FIG. 9.

Figure 10:
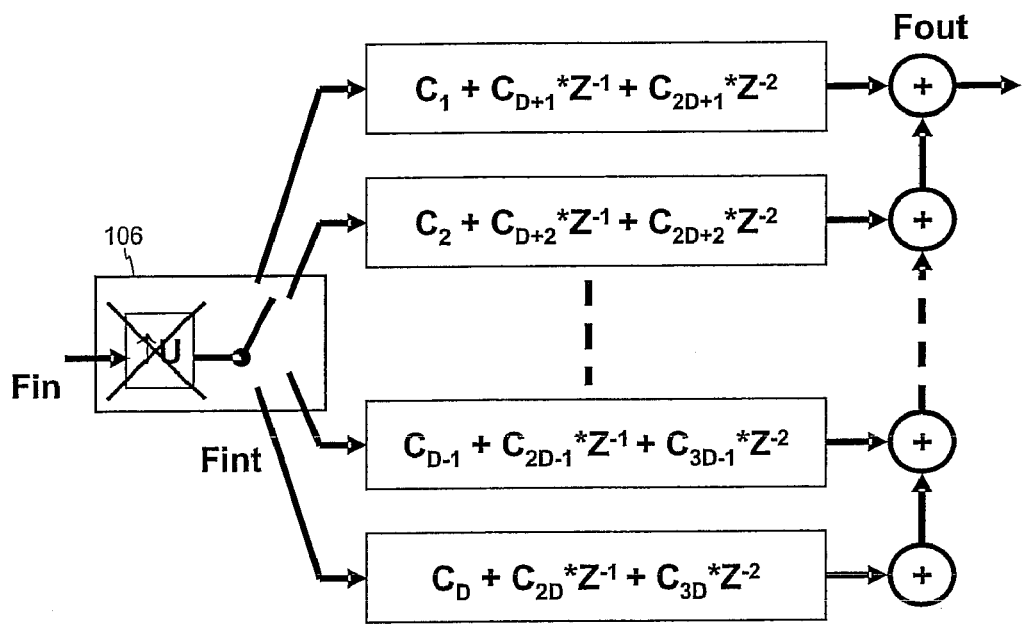
FIG. 10 shows the resulting Sample Rate Converter using a polyphase filter.

The next step, shown in FIG. 10, combines the functions of the up-sampling unit and commutative switch into a single element 106 which removes the need to perform up-sampling. This new element 106 will be called a modulo commutative switch. This switch 106 skips certain branches of the polyphase filter during operation. Conventionally, an up-sampling unit inserts zeros between samples of the input signal in a controlled manner (e.g. up-sampling by a factor of four will insert three zeros between every input sample) to create a data stream at the new, higher, rate. The modulo commutative switch 106 operates in a manner which skips those filter branches which would perform operations on the new samples having a value of zero, and which would be inserted by the up-sampling unit. The number of branches skipped is U−1, where U is the up-sampling (interpolation) rate. This allows the sample rate converter to operate at the frequency of the input signal and reduces the amount of computation performed by the converter, thus allowing the design to be efficiently implemented. FIG. 10 shows the filter structure, with each polyphase branch rewritten to replace the expressions as functions of E(z) with the filter coefficients C and delays as previously derived in Equations 2 and 3. It will be noted that the polyphase filter shown in FIG. 10 has a total of 3D coefficients to allow it to be represented in polyphase form with D polyphase branches (the filter actually has 3D−2 coefficients). The additional coefficients are set to zero.

Figure 11:
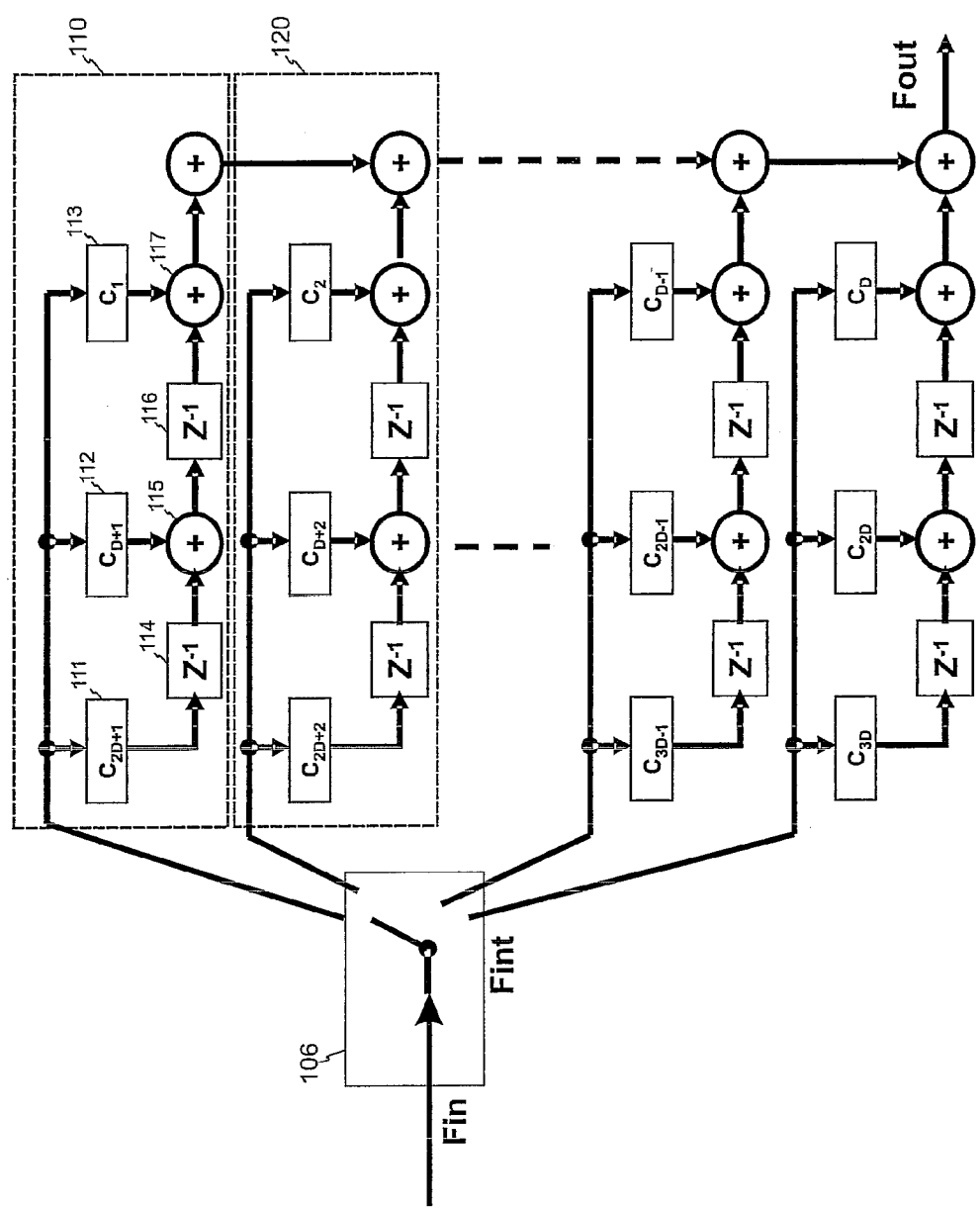
FIG. 11 shows the polyphase filter of FIG. 10 in expanded form, showing individual elements.

A further series of transformations will now be described which allow the converter to be implemented using a reduced amount of hardware. Firstly, FIG. 11 shows the converter of FIG. 10 expanded into individual elements. Each polyphase filter branch is expanded to show the filter coefficients C and individual delay elements $z^{-1}$. As an example, polyphase filter branch 110 includes coefficients 111, 112, 113, delay elements 114, 116 and adders 115, 117. The conventional notation used here is that an input signal is multiplied by a coefficient when it passes through a coefficient box (e.g. an input sample is multiplied by coefficient $C_{2D+1}$ when it passes through box 111.) The FIR polyphase filters are computed using the second direct form structure (where the delay line is for the output samples and not for the input samples). Each filter branch 110, 120 has the same form, with a different set of filter coefficients.

Figure 12:
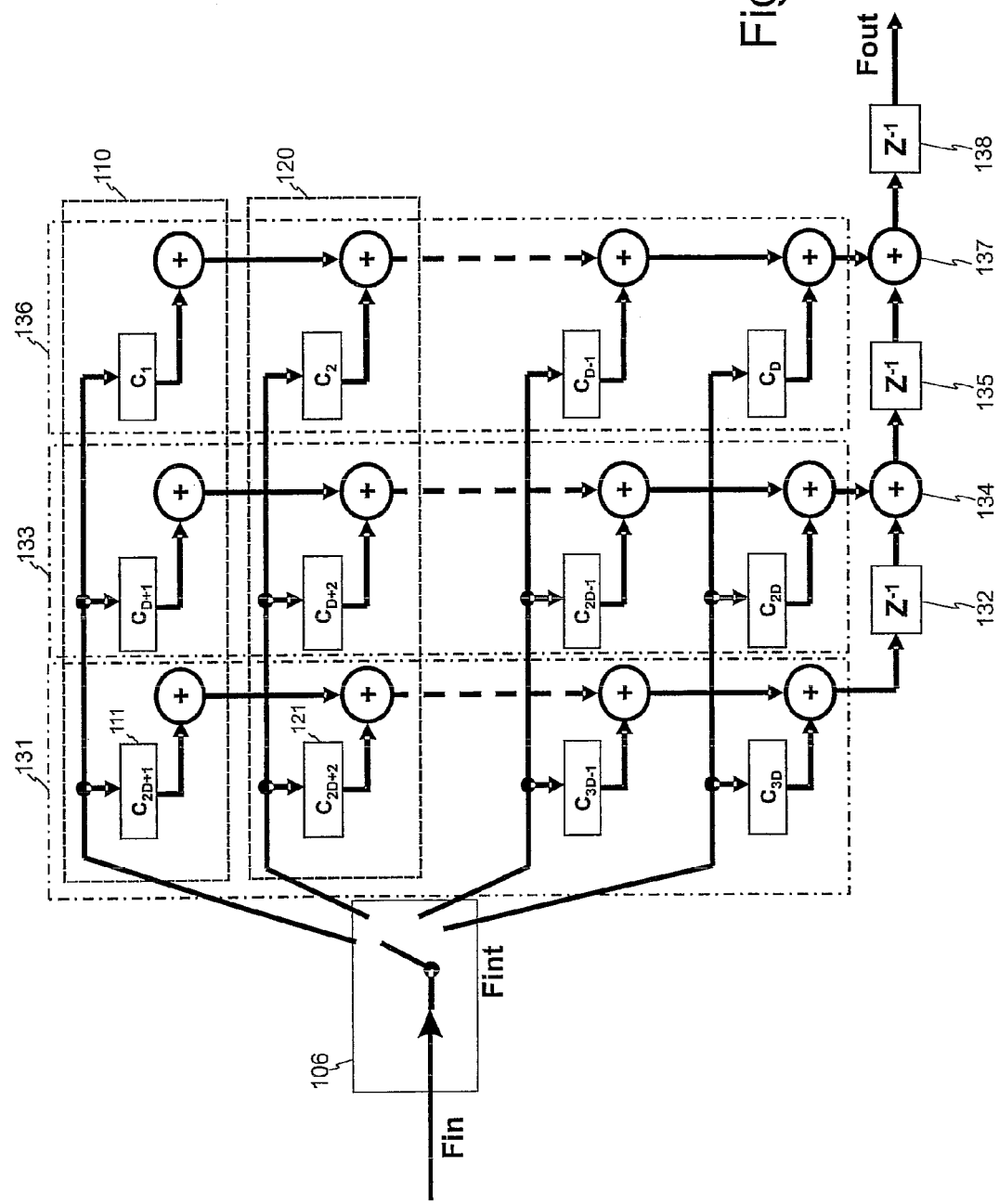
FIG. 12 shows how the filter of FIG. 11 can be rearranged.

FIG. 12 shows the operations performed in a different, but equivalent, manner. As before, each filter branch 110, 120 performs a set of multiplications of an input sample by a filter coefficient. The results of these individual multiplications (e.g. coefficient 111 multiplied with the input signal in branch 110) are passed down the respective columns of the filter, to be summed with similar multiplications in other filter branches. The columns are shown as 131, 133, 136. Thus, the multiplication of an input sample with the first coefficient 111 in branch 110 is summed with the result of the multiplication of another input sample with the first coefficient 121 in branch 120. At the base of column 131, the overall accumulated total of products is delayed 132 before being summed 134 with the accumulated total of products in column 133. Similarly, this is delayed 135 before being summed 137 with the accumulated total of products in column 136. Due to the nature of operation of the commutative switch 106, not all filter branches 110 will calculate a multiplication of a coefficient with an input sample during a cycle of the switch. The delay 132, 135 lasts for the duration of one cycle of the commutative switch 106 through the set of branches, although as explained, the switch will skip a number of the branches during a cycle. The rearrangement described above reduces the number of required delay elements to two, namely elements 132 and 135.

Figure 13:
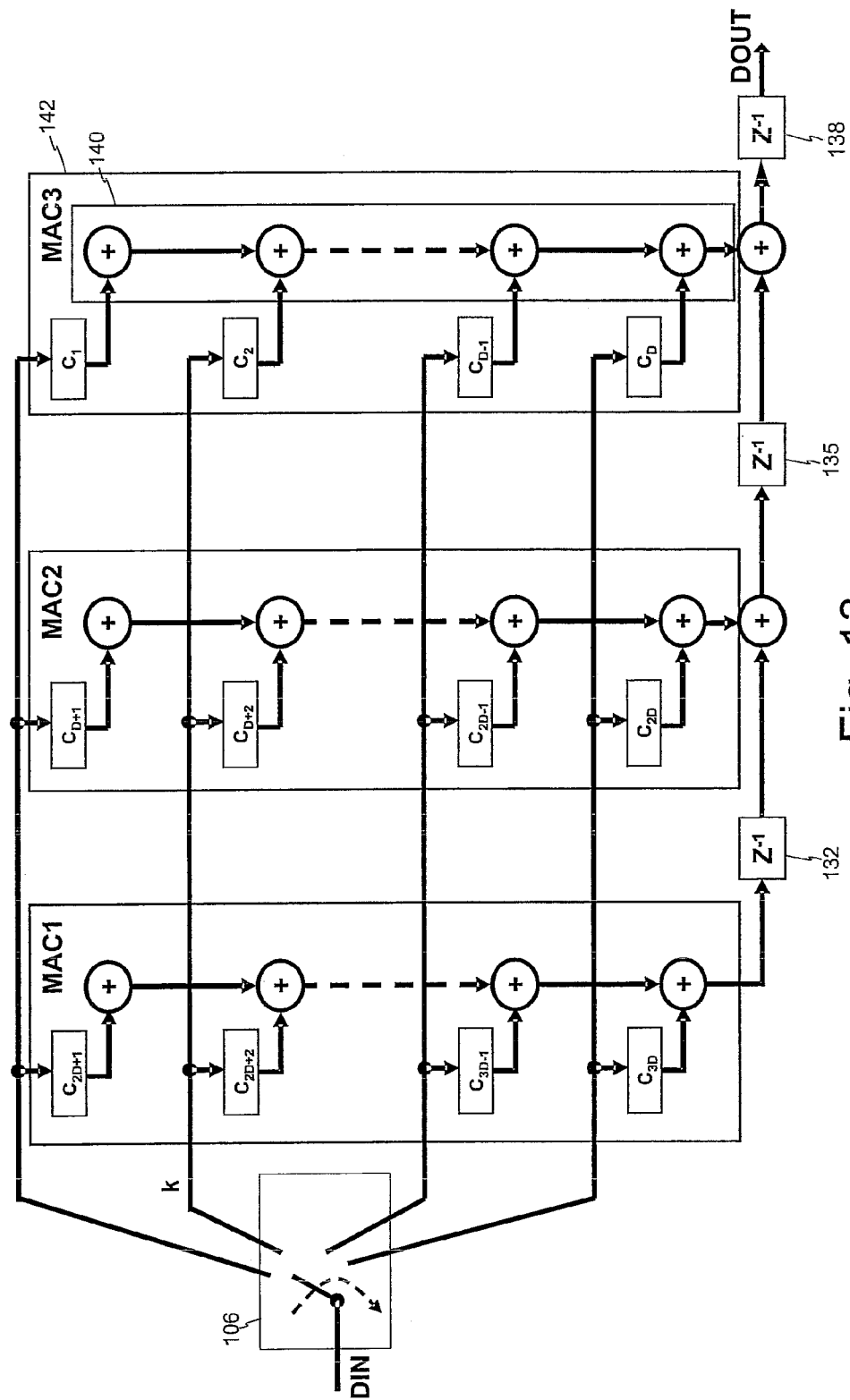
FIG. 13 shows the allocation of Multiplier and Accumulator (MAC) units to columns of the filter of FIG. 12.

FIG. 13 shows how all of the adders from one column 131, 133, 136 can be implemented in hardware as a single accumulator 140. The converter requires just three accumulators. Since a multiplication needs to be performed before every addition, the accumulators are each implemented as Multiplication and Accumulation (MAC) units 142 shown as MAC1, MAC2, MAC3. The delay elements 132, 135, 138 are not required as separate items in the implementation as each MAC unit accumulates (stores) results from filter branches over the course of a cycle of the switch and thus performs the function of the delay element.

Figure 14:
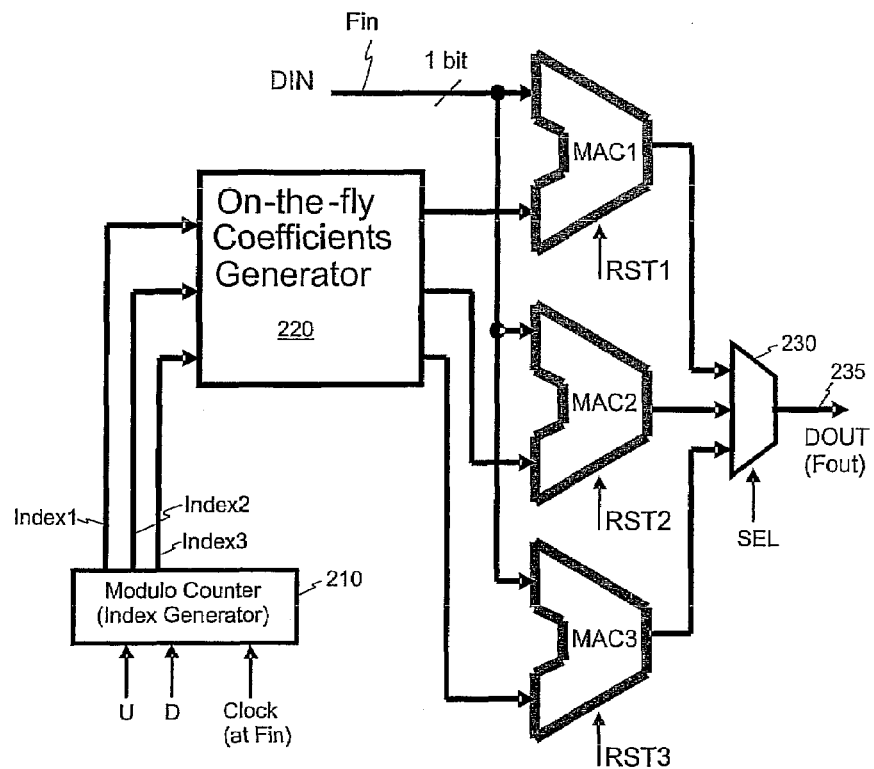
FIG. 14 shows a hardware implementation of the filter of FIG. 13.

FIG. 14 shows the overall hardware implementation. A counter 210 receives inputs identifying the up-sampling rate U and the down-sampling rate D. The counter 210 maintains, and outputs, three values Index1, Index2, Index3 which identify coefficients that should be generated at that point in time. These identify the individual filter coefficients shown in FIGS. 11–13. A coefficients generator 220 generates the three coefficients identified by the index values and applies the coefficients to the MAC units MAC1, MAC2, MAC3. The coefficients are calculated according to the formula shown in Equation 2, i.e.

$$C_k = \begin{cases} \frac{k(k+1)}{2} & \text{if } k \leq D \\ \frac{[(k-N)(3D-3-2k)+(D+1)]}{2} & \text{if } D < k \leq \frac{(3D-2)}{2} \\ C_{3D-2-k} & \text{if } k > \frac{(3D-2)}{2} \end{cases}$$

where k is substituted by the value of the indexes Index1, Index2, Index3 output by counter 210.

The MAC units also receive input samples from an input DIN. Output samples are taken from outputs of the MAC units. It can be seen that the filter branches which have been schematically shown in the previous Figures are implemented as they are required by applying the required coefficients for that branch to the MAC units MAC1, MAC2, MAC3. During the next step a different set of filter coefficients are applied to the MAC units to implement a different filter branch, with the MAC units accumulating the results of each multiplication of a coefficient with an input sample that they perform. A multiplexer 230, under the control of a selection signal SEL, selects the output of which MAC unit should be applied to the output 235. MAC units are periodically reset by reset signals RST1, RST2, RST3 as described further below. Counter 210 also receives a clock signal with input frequency Fin which is in synchronism with the samples arriving at input DIN. At each operating cycle three new coefficients are required according to Index1, Index2, Index3. These coefficients can either be calculated in parallel with one another or in series, i.e. one after another. For the series implementation, in each operating cycle a single coefficient generation module generates the first, second and third coefficients that are required for that operating cycle in a time-multiplexed manner. This has an advantage of reducing the amount of computation hardware required for calculating the coefficients.

FIG. 15 shows a table of values which illustrate operation of the converter for an up-sampling rate of U=4 and a down-sampling rate of D=17. The operation of the hardware is shown for a sequence of 19 steps, where a 'step' is one position of the commutative switch 106. For each step, the following values are given: the filter branch number that the switch connects to; the filter coefficient index values Index1, Index2, Index3; an example value for data in, the values held in the three accumulators MAC1, MAC2, MAC3 and an indication of which MAC unit the output is taken from. It can be seen that the converter operates on every Uth filter branch (i.e. it skips every U−1 branches). At step 1 the converter operates on filter branch 1, at step 2 the converter operates on filter branch 5, at step 3 on filter branch 9, at step 4 on filter branch 13, at step 5 on filter branch 17. At this point the switch has completed one 'cycle' around the filter branches but it has only connected to some of the filter branches. It continues at step 6 by connecting to filter branch 4, at step 7 by connecting to filter branch 8, and so on. The sign "+" in the table means that the MAC takes the previous value held in the accumulator plus the value given by the multiplication of the current coefficient obtained using the index with the current input data (DIN1). As an example, at step 3 the MAC2 unit multiplies the coefficient given by Index2 (having a value of 26) with the data input value 1 and adds this to the value already held in the accumulator. In another example, after step 5 the MAC unit MAC3 is reset to zero because an output is taken from that unit. At the next step, step 6, we see that the MAC unit MAC3 has the value −10 because the input data is −1, the coefficient given by Index3 (4) is 10 and the resulting product is summed with an empty accumulator. To avoid any confusion, the content of the MAC that is sent to DOUT is whatever value the MAC should have at that time according to the rules presented above. Immediately after outputting that value to DOUT the MAC unit is reset to zero. The three filter coefficient indexes are always offset from each other by D. At each step, one filter coefficient index equals the filter branch number, a second filter coefficient index equals the filter branch number +D and a third filter coefficient index equals the filter branch number +2D. This relationship is shown in Equation 4.

The filter coefficient indexes Index1, Index2, Index3 shown in the table of FIG. 15 are arranged in a manner which avoids the need to shuffle data between accumulators during operation. Looking at FIG. 13, it can be seen that the summation obtained at the base of the first column is then added to the summation obtained at the base of the second column. To implement this, the value held in MAC1 can be transferred, after one switching cycle, to MAC2 so that MAC2 then continues to accumulate the multiplications performed during the second cycle of operation. Similarly, the value held in MAC2 can be transferred, after the next cycle, to MAC3 so that MAC3 then continues to accumulate the multiplications performed during the third cycle of operation. At the end of this third cycle an output sample is taken from MAC3. In order to avoid moving the content of the MAC units from one storage element to another every time a full cycle is completed by the switch the indexes are managed in an improved way. Following Index3 in the table, when it reaches value 51 (at step 5), the content of MAC3 is sent to the output; then it should happen that MAC2 content is moved to MAC3, MAC1 content is moved to MAC2 and MAC1 should start from 0 again. Index1 should restart with value 4, Index2 should be 21 and Index3 should be 38. Instead, what happens is that the indexes are managed in such a way that the accumulation will continue on the MAC2 unit and this unit will be the one that will provide the output sample when a new cycle is completed by the commutative switch (at step 9). Then, it will be the turn of MAC1 unit to become the one that will provide the output sample. Normally, Index1 should have values between 1 and 17, Index2 should have values between 18 and 34 and Index3 should have values between 35 and 51. Instead, the indexes Index1, Index2, Index3 have the values shown in the table and this avoids moving data between the MAC units.

Figure 16:
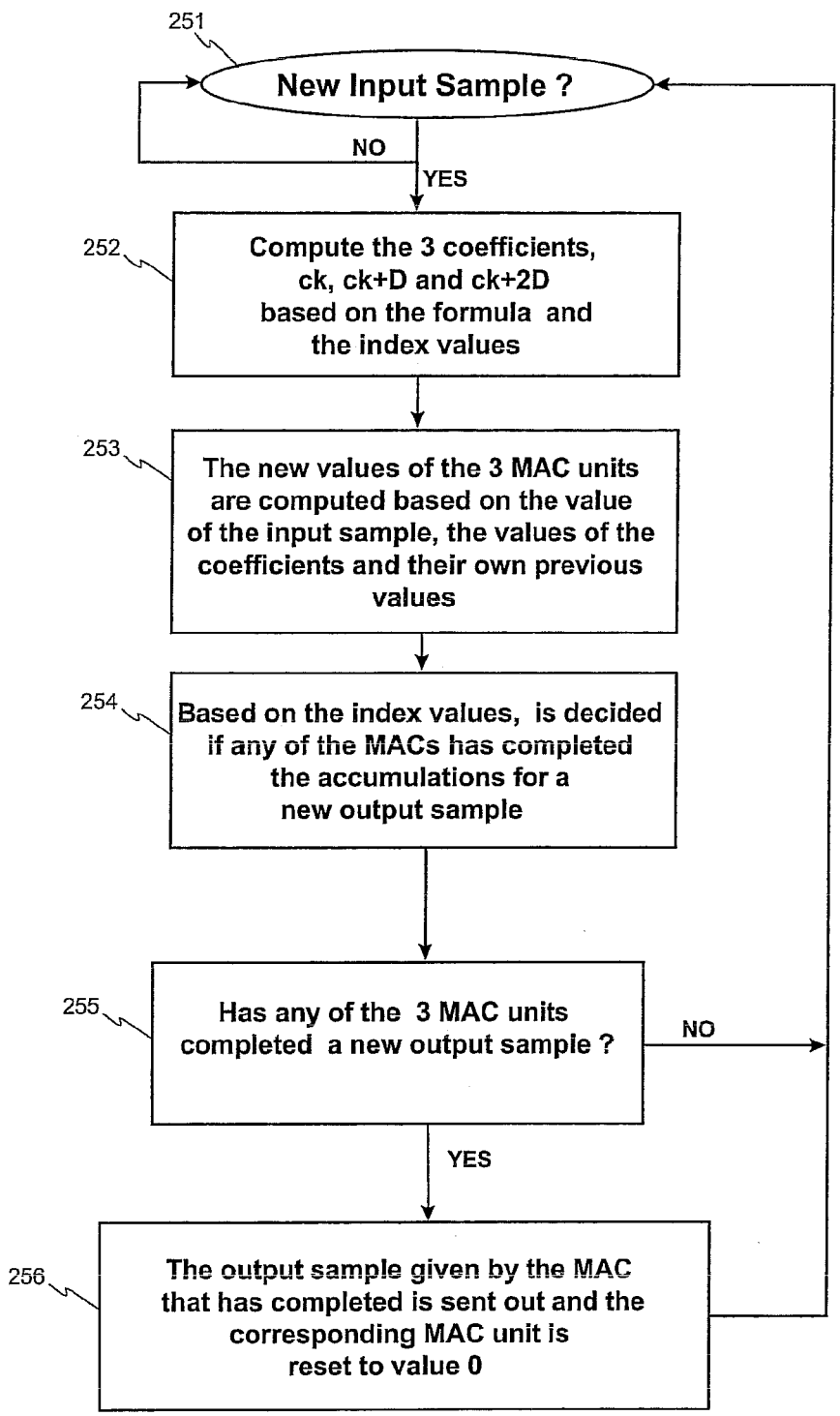
FIGS. 16 and 17 are flow charts describing operation of the hardware.
Figure 17:
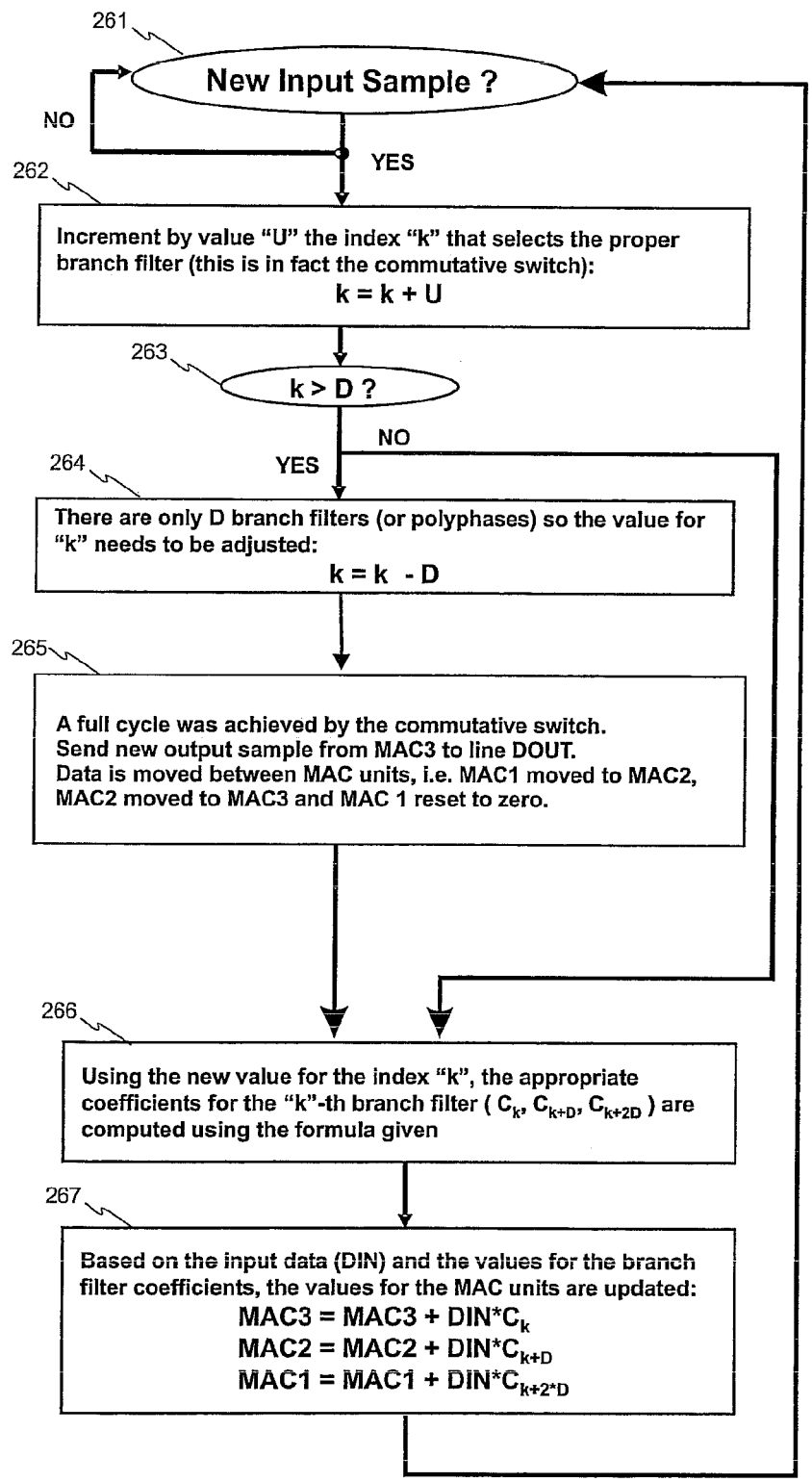

FIGS. 16 and 17 show flow charts describing operation of the converter. FIG. 16 is a simplified flow chart of the overall operation. Step 251 waits for a new input sample to arrive on line DIN. At step 252 the three coefficients are computed based on the index values Index1, Index2, Index3 and using the formula show in Equation 2. At step 253 each of the three MAC units performs a multiplication of the new input sample with the coefficient value and adds this to the accumulated value already held. At step 255 a check is made as to whether any of the MAC units is ready to output a sample value. As described above, this will occur when the MAC unit has accumulated products over three full cycles. If a MAC unit is ready, the output is sent on line DOUT and the accumulator is reset to zero. If not, the converter waits for a new input sample to arrive.

FIG. 17 describes the process in more detail. As before, at step 261 the converter waits for a new input sample to arrive on line DIN. An index k is maintained, which indicates the branch filter that should be selected. This is incremented by the value U (the up-sampling factor) at step 262, each time a new sample arrives. The value of index k is tested at step 263. If the value of k (the index to the filter branch number) exceeds D, which is the total number of branch filters, the value of k is adjusted so that it lies in the range 0<k<D, using the adjustment at step 264.

The value of k (the index to the filter branch number) exceeding D indicates that the converter has completed a cycle through the filter branches. After each cycle one MAC unit is required to output a sample value. As described above, there are two schemes for achieving this. In the first scheme, described in this flow chart, each MAC unit is assigned to one column of the filter and is used for one cycle before passing the accumulated value across to the accumulator assigned to the next column. At step 265 a full cycle is achieved by the commutative switch (i.e. the switch 106 has cycled through the set of branches, skipping every U−1 filter branches). Data is moved between MAC units, with the value held by MAC1 being moved to MAC2, the value held by MAC2 being moved to MAC3 and MAC1 being reset to zero. In the second scheme, not shown in this flow chart, each MAC unit accumulates values through three cycles and outputs a value at the end of three cycles. The index values applied to each MAC unit are managed to ensure that each MAC unit applies the correct coefficients during each cycle. The table shown in FIG. 15 describes a way of managing the index values using this second scheme.

Figure 2:
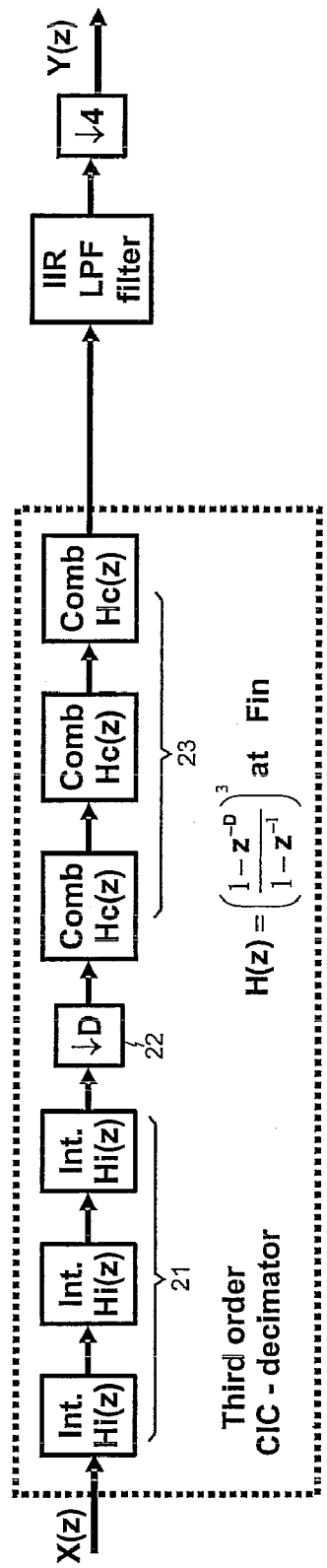
FIG. 2 shows a decimator using a conventional Cascaded Integrator Comb (CIC) filter.
Figure 3:
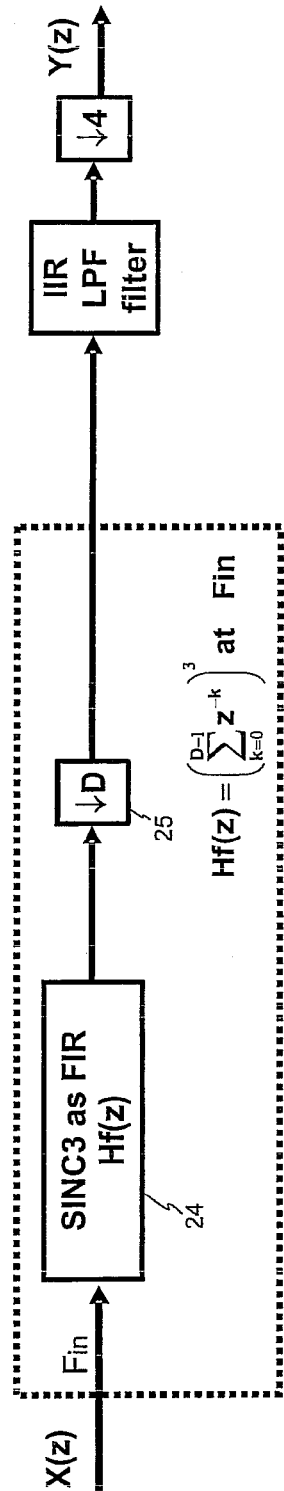
FIG. 3 shows decimator based using a SINC3 FIR filter.
Figure 4:
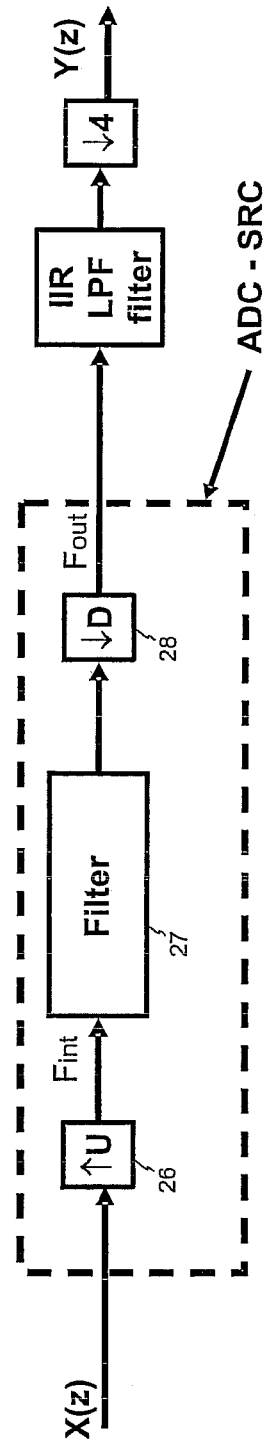
FIG. 4 schematically shows a Sample Rate Converter (SRC)

At step 266 the index values are used to calculate the three coefficient values, using the formula shown in FIG. 2. At step 267 each MAC unit performs a multiplication of the new input sample (DIN) with a respective coefficient and adds this to the previously accumulated result.

Figure 18A:
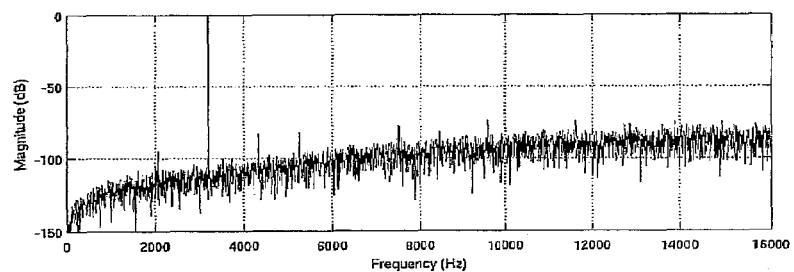
FIGS. 18A and 18B contrast output spectrum performance of the converter according to the invention with the converter shown in FIG. 5.
Figure 18B:
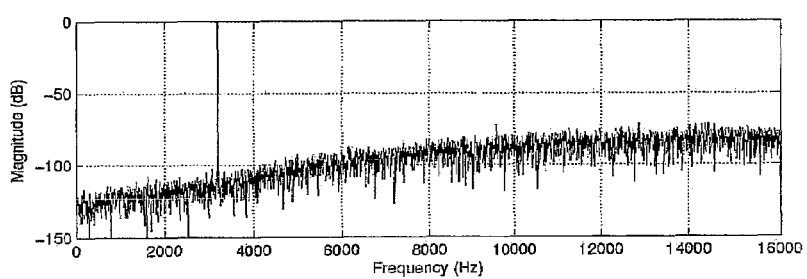

FIG. 18A shows a plot of the frequency spectrum at the output of the ADC-SRC block of the arrangement shown in FIG. 5 and FIG. 18B shows a plot of the frequency spectrum at the output of the ADC-SRC block of the arrangement according to this invention. For a meaningful comparison the SINC4 block was also included in FIG. 5. The same tone (~3.2 kHz) is applied at the their inputs. The band of interest is the one from 0 to FS/2 (i.e. up to 4 kHz) and it can be seen the two sets of apparatus are similar in performance.

Figure 19:
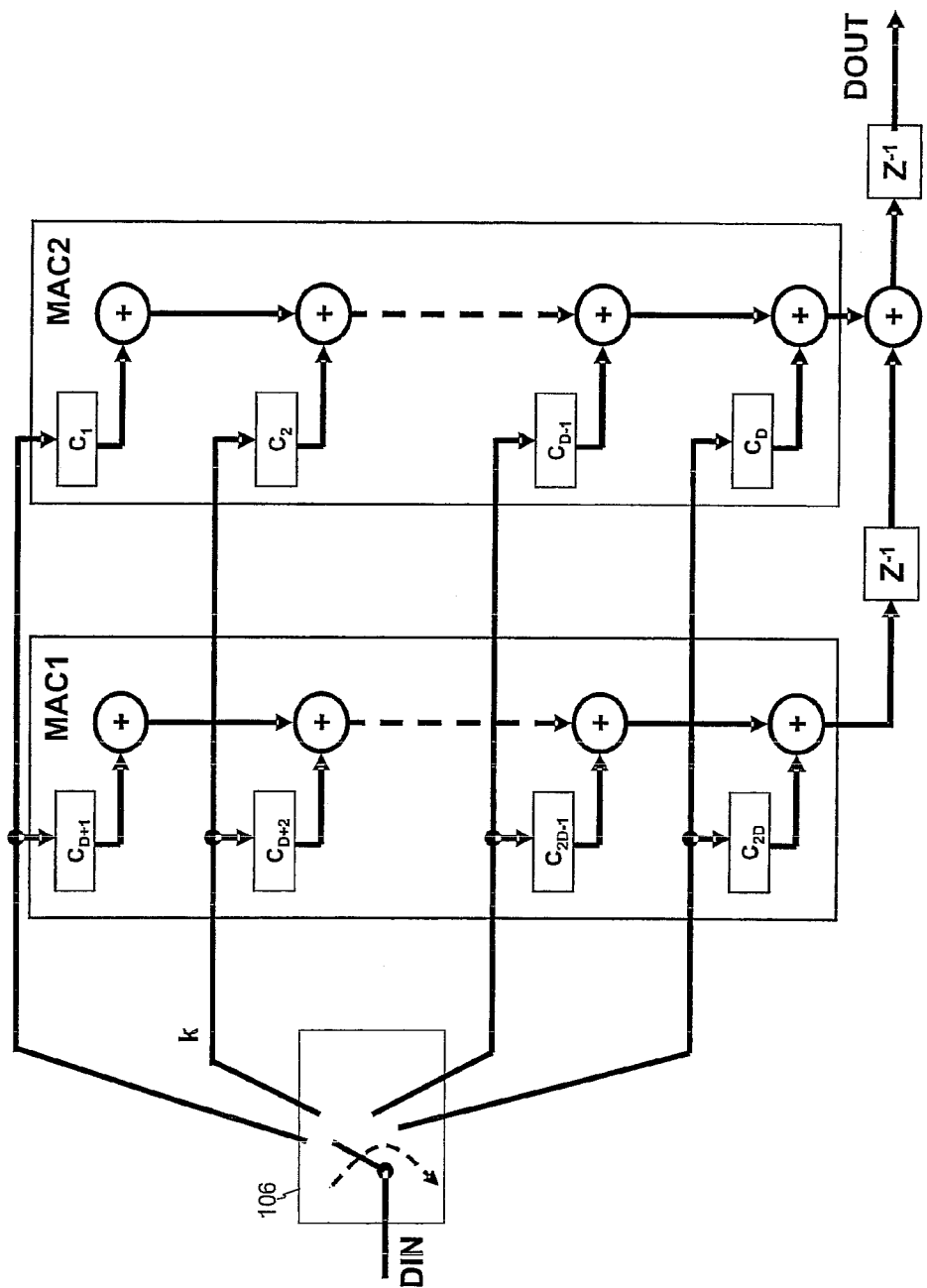
FIG. 19 shows a Sample Rate Converter according to a further embodiment of the invention having an FIR filtering stage with a SINC2 response; and, FIG. 20 shows a Sample Rate Converter according to a further embodiment of the invention having an FIR filtering stage with a SINC4 response.

The above described embodiment provides an FIR filtering stage having a SINC3 response, i.e. a third order SINC response. The invention is not limited to a filtering stage having this type of response, and alternative embodiments are possible in which the FIR filtering stage has a different response. FIG. 19 shows a Sample Rate Converter having an FIR filtering stage with a SINC2 response. Each of the D polyphase branches has two coefficients, giving a total set of 2D filter coefficients. The corresponding hardware uses two MAC units MAC1, MAC2 and requires two index generators (i.e. a counter 210 FIG. 14 which generates two indexes). The hardware operates as previously described. The set of 2D filter coefficients are given by the formula:

$$c_k = \begin{cases} k, & \text{if } k \leq D \\ 2D - k, & \text{if } D < k \leq 2D - 1 \\ 0, & \text{if } k = 2D \end{cases}$$

where k is an index to the filter coefficient.

Figure 20:
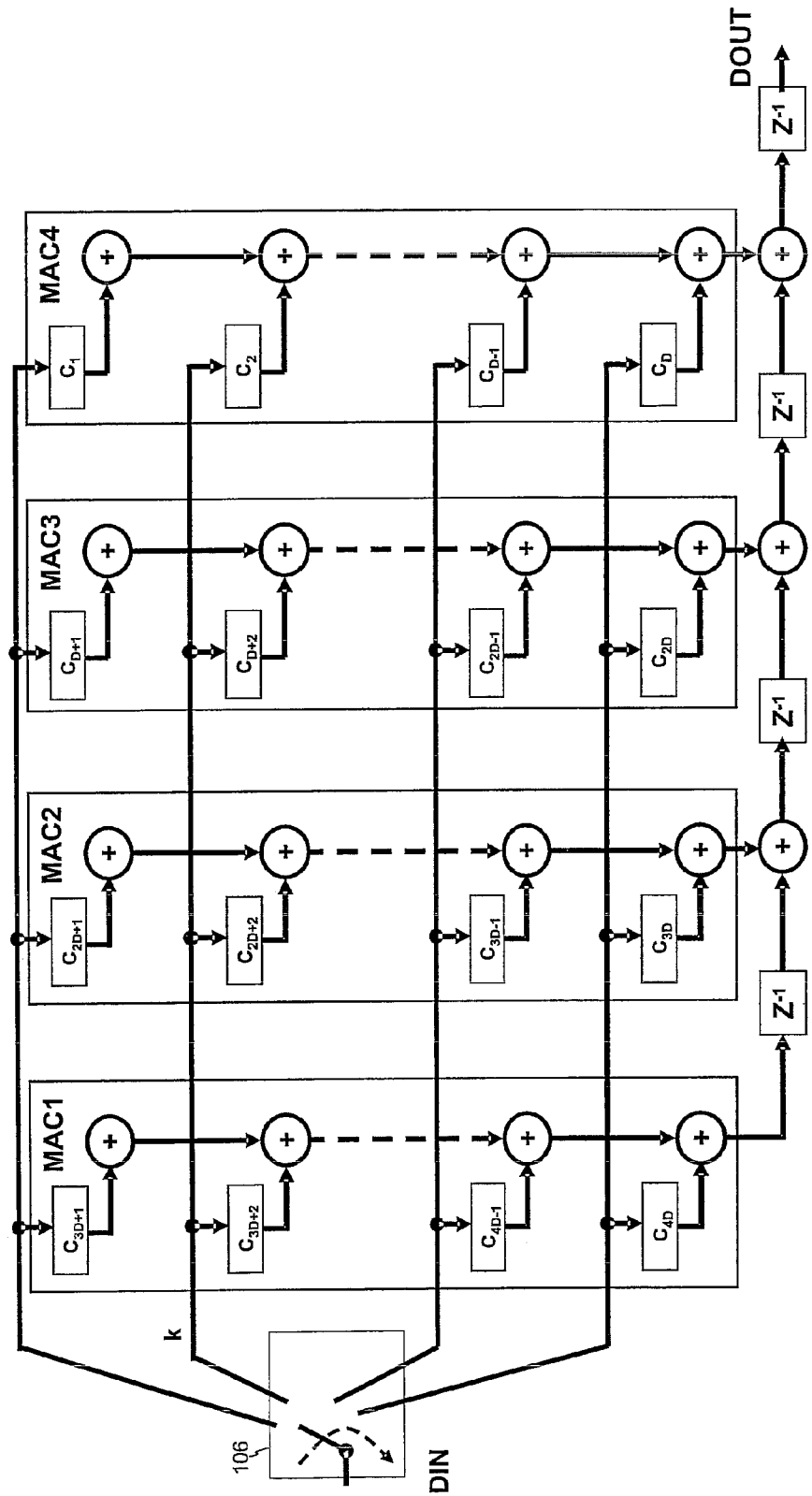

FIG. 20 shows a Sample Rate Converter having an FIR filtering stage with a SINC4 response. Each of the D polyphase branches has four coefficients, giving a total set of 4D filter coefficients. The corresponding hardware uses four MAC units: MAC1, MAC2, MAC3, MAC4 and requires four index generators (i.e. a counter 210 FIG. 14 which generates four indexes). The hardware operates as previously described. The set of 4D filter coefficients are given by the formula:

$$c_k = \begin{cases} \dfrac{[k(k+1)\cdot(k+2)]}{6}, & \text{if } k \leq D \\ [(2D-k)\cdot(k^2+N^2-kN+3k+2) + \\ \quad \dfrac{3(3N-1)(k^2+k-N^2-N)]}{6} + \\ [-k(k+1)(2k+1)+N(N+1) \\ \quad \dfrac{(2N+1)-9N(N-1)(k-N)]}{6} & \text{if } D < k \leq \dfrac{(4D-3)}{2} \\ c_{4D-3-k}, & \text{if } k > \dfrac{(4D-3)}{2} \\ 0 & \text{elsewhere} \end{cases}$$

where k is an index to the filter coefficient.

The corresponding hardware will require four MAC units and four index generators which operate as previously described.

The order of the filtering stage determines the number of columns, and hence the number of MAC units required. In general, an Nth order filter requires N MAC units and will require N indexes to be maintained and N coefficients to be generated at each step.

In the above described embodiment filter coefficients are calculated as they are required. It is, of course, possible to simply retrieve filter coefficients from a look-up table instead of calculating them in this manner. An advantage of calculating coefficients on demand is that the conversion rate can readily be changed simply by modifying the values of U and D applied to the counter. Implementing multiple conversion rates in a converter which retrieves coefficients from a look-up table would require multiple sets of coefficients to be stored.

While the above embodiment describes an input signal comprising 1-bit samples, the invention can also be applied to multi-bit input signals. The three MAC units will need to be capable of performing multiplications with numbers that are not just 1 or −1 but other respects of the invention remain the same.

The invention is not limited to the embodiments described herein, which may be modified or varied without departing from the scope of the invention.

The invention claimed is:

1. A sample rate converter for reducing the sampling rate of a signal by a fractional number U/D, where U represents an up-sampling rate and D represents a down-sampling rate, the converter comprising:
    an input for receiving an input data stream at a first rate;
    an FIR filtering stage comprising a set of D polyphase filter branches, each branch including a set of filter coefficients for operating on a sample of the input signal;
    a commutative switch which is arranged to selectively connect a sample of the input data stream to one of the polyphase filter branches, the switch being arranged to skip every U−1 filter branches during a cycle through the filter branches and,
    an output for outputting an output data stream at a second data rate which is lower than the first data rate, wherein each polyphase filter branch comprises a set of coefficient multiplication stages where a coefficient is multiplied by an input sample, and the commutative switch comprises a counter which is arranged to selectively output indexes to filter coefficients for a required filter branch and a coefficient generator which generates the filter coefficients for use in the coefficient multiplication stages of the required filter branch.

2. The sample rate converter of claim 1 wherein the coefficient generator calculates the filter coefficients according to a stored formula.

3. The sample rate converter of claim 2 wherein the FIR filtering stage has a SINC3 response and the coefficient generator calculates the filter coefficients according to the formula:

$$C_k = \begin{cases} \dfrac{k(k+1)}{2} & \text{if } k \leq D \\ \dfrac{[(k-N)(3D-3-2k)+(D+1)]}{2} & \text{if } D < k \leq \dfrac{(3D-2)}{2} \\ C_{3D-2-k} & \text{if } k > \dfrac{(3D-2)}{2} \end{cases}$$

where k is an index to the filter coefficient.

4. The sample rate converter of claim 1 wherein the coefficient generator retrieves the filter coefficients from a table of stored coefficients.

5. The sample rate converter of claim 1 wherein each polyphase filter branch comprises N coefficient multiplication stages where an input sample is multiplied by a filter coefficient, and wherein the converter comprises N multiplier and accumulation units, with each multiplier and accumulation unit being arranged to perform one coefficient multiplication stage of each of the filter branches selected by the commutative switch during a cycle through the set of filter branches and to accumulate results of the multiplication stages.

6. The sample rate converter of claim 5 wherein each multiplier and accumulation unit is arranged to accumulate results of the same coefficient multiplication stage in each of the filter branches selected by the commutative switch during a cycle of the commutative switch through the set of filter branches and to forward an accumulated result to a next multiplier and accumulation unit after each cycle.

7. The sample rate converter of claim 5 wherein a coefficient generator generates a set of coefficients for a selected filter branch and the coefficient generator is arranged to output coefficients in a manner which causes results of multiplication stages in N consecutive cycles of the commutative switch to be accumulated on the same multiplier and accumulation unit.

8. An integrated circuit comprising the sample rate converter of claim 1.

9. A sample rate converter for reducing the sampling rate of a signal by a fractional number U/D, where U represents an up-sampling rate and D represents a down-sampling rate, the converter comprising:
    an input for receiving an input data stream at a first rate;
    an FIR filtering stage comprising a set of D polyphase filter branches, each branch including a set of three filter coefficients for operating on a sample of the input signal;
    a commutative switch which selectively connects a sample of the input data stream to one of the polyphase filter branches, the switch being arranged to skip every U−1 filter branches during a cycle through the filter branches; and
    an output for outputting an output data stream at a second data rate which is lower than the first data rate, wherein each polyphase filter branch comprises three coefficient multiplication stages where an input sample is multiplied by a filter coefficient, and wherein the converter comprises three multiplier and accumulation units, with each multiplier and accumulation unit being arranged to perform one coefficient multiplication stage of each of the filter branches selected by the commutative switch during a cycle through the set of filter branches and to accumulate results of the multiplication stages.

10. A method of performing sample rate conversion of an input data stream by a fractional number U/D, where U represents an up-sampling rate and D represents a down-sampling rate, the method comprising:
    receiving an input data stream at a first rate;
    applying the input data stream to an FIR filtering stage comprising a set of D polyphase filter branches, each branch including a set of filter coefficients for operating on a sample of the input signal;
    selectively applying a sample of the input data stream to one of the polyphase filter branches, and skipping every U−1 filter branches during a cycle through the filter branches; and,
    outputting an output data stream at a second data rate which is lower than the first data rate, wherein each polyphase filter branch comprises a set of coefficient multiplication stages where an input sample is multiplied by a coefficient, and the step of selectively applying a sample of the input data stream to one of the polyphase filter branches comprises generating the filter coefficients for use in the coefficient multiplication stages of the required filter branch and multiplying the sample of the input data stream with the filter coefficients.

11. The method of claim 10 wherein the coefficient generator calculates the filter coefficients according to a stored formula.

12. The method of claim 11 wherein the FIR filtering stage has a SINC3 response and the filter coefficients are generated according to the formula:

$$C_k = \begin{cases} \dfrac{k(k+1)}{2} & \text{if } k \leq D \\ \dfrac{[(k-N)(3D-3-2k)+(D+1)]}{2} & \text{if } D < k \leq \dfrac{(3D-2)}{2} \\ C_{3D-2-k} & \text{if } k > \dfrac{(3D-2)}{2} \end{cases}$$

where k is an index to the filter coefficient.

13. The method of claim 10 wherein the filter coefficients are retrieved from a table of stored coefficients.

14. The method of claim 10 wherein each polyphase filter branch comprises N coefficient multiplication stages where a coefficient is multiplied by an input sample, and the step of multiplying the sample of the input data stream with the filter coefficients is performed by N multiplier and accumulation (MAC) units, the method further comprising using each multiplier and accumulation unit to accumulate the results of the coefficient multiplication stages of the selected filter branches.

15. The method of claim 14 further comprising using each multiplier and accumulation unit to accumulate the results of the same coefficient multiplication stage of the selected filter branches and to forward an accumulated result to a next multiplier and accumulation unit after each cycle through the set of filter branches.

16. The method of claim 14 further comprising generating a set of coefficients for a selected filter branch and outputting coefficients in a manner which causes results of multiplication stages to be accumulated on the same multiplier and accumulation unit during N consecutive cycles through the set of filter branches.

17. A digital signal resulting from the method of claim 10.

18. A machine-readable medium carrying instructions for causing a processor to perform sample rate conversion of an input data stream by a fractional number U/D, where U represents an up-sampling rate and D represents a down-sampling rate, the instructions causing the processor to:

receive an input data stream at a first rate;

apply the input data stream to an FIR filtering stage comprising a set of D polyphase filter branches, each branch including a set of filter coefficients for operating on a sample of the input signal;

selectively apply a sample of the input data stream to one of the polyphase filter branches, and skip every U−1 filter branches during a cycle through the filter branches; and, output an output data stream at a second data rate which is lower than the first data rate, wherein each polyphase filter branch comprises a set of coefficient multiplication stages where an input sample is multiplied by a coefficient, and the step of selectively applying a sample of the input data stream to one of the polyphase filter branches comprises generating the filter coefficients for use in the coefficient multiplication stages of the required filter branch and multiplying the sample of the input data stream with the filter coefficients.

* * * * *